(12) United States Patent
Wu et al.

(10) Patent No.: US 8,717,209 B2
(45) Date of Patent: May 6, 2014

(54) SUCCESSIVE EQUALIZER FOR ANALOG-TO-DIGITAL CONVERTER (ADC) ERROR CORRECTION

(75) Inventors: Jiangfeng Wu, Irvine, CA (US); Tianwei Li, Irvine, CA (US); Wenbo Liu, Costa Mesa, CA (US); Wei-Ta Shih, Irvine, CA (US); Chun-Ying Chen, Irvine, CA (US); Lin He, Irvine, CA (US); Randall Perlow, San Clemente, CA (US); Binning Chen, Irvine, CA (US); Ramon Gomez, San Juan Cap, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/604,184

(22) Filed: Sep. 5, 2012

(65) Prior Publication Data

US 2014/0062738 A1    Mar. 6, 2014

(51) Int. Cl.
*H03M 1/06*    (2006.01)

(52) U.S. Cl.
USPC ............................ 341/118; 341/155; 341/161

(58) Field of Classification Search
USPC .................. 341/117–120, 155, 161
See application file for complete search history.

(56) References Cited

U.S. PATENT DOCUMENTS

| | | | | |
|---|---|---|---|---|
| 5,936,562 A * | 8/1999 | Brooks et al. | ................. | 341/143 |
| 6,839,016 B2 * | 1/2005 | Roza | .............................. | 341/161 |
| 7,443,332 B2 * | 10/2008 | Knudsen | ........................ | 341/161 |
| 7,649,480 B2 * | 1/2010 | Boomer et al. | ................ | 341/120 |
| 2004/0217896 A1 * | 11/2004 | Cesura et al. | .................. | 341/161 |
| 2004/0233081 A1 * | 11/2004 | Cesura et al. | ................. | 341/118 |
| 2005/0057384 A1 * | 3/2005 | Chen et al. | ..................... | 341/143 |

* cited by examiner

*Primary Examiner* — Jean B Jeanglaude
(74) *Attorney, Agent, or Firm* — Sterne, Kessler, Goldstein & Fox P.L.L.C.

(57) ABSTRACT

Various pipeline ADCs are disclosed that substantially compensate for interference or distortion that results from imperfections with various ADC modules of the pipeline ADCs. The pipeline ADCs include various ADC stages and various compensation stages that are coupled to the various ADC stages. The various ADC stages convert their corresponding analog inputs from an analog signal domain to a digital signal domain to provide various digital output signals and various analog residual signals to subsequent ADC stages. The various compensation stages compensate for interference or distortion that is impressed onto the various analog residual signals which results from imperfections within previous ADC stages.

20 Claims, 8 Drawing Sheets

SUCCESSIVE EQUALIZER FOR ANALOG-TO-DIGITAL CONVERTER (ADC) ERROR CORRECTION

BACKGROUND

1. Field of Disclosure

The disclosure relates to analog to digital conversion, and more specifically, compensation for various impairments within a pipeline analog-to-digital converter (ADC).

2. Related Art

Data converters are frequently used in mixed-signal electronic systems.

Mixed signal electronic systems include both analog signal domains and digital signal domains. The analog signal domains primarily operate upon analog signals while the digital signal domains primarily operate upon digital signals. A mechanism is required to transport signals from one domain, such as the analog signal domain, to another domain, such as the digital signal domain. Commonly, an analog-to-digital converter (ADC) is used to convert analog signals from the analog signal domain to digital signals for the digital signal domain.

A conventional pipeline ADC includes multiple ADCs, whereby a quantization error from a former ADC is provided to a later ADC. This later ADC then converts the quantization error from the former ADC to the digital signal domain. However, imperfections within the conventional pipeline ADC can cause impairments, such as settling errors, amplitude offsets, and/or direct current (DC) offsets to provide some examples, within various signals of the conventional pipeline ADC that can cause the digital signals to no longer accurately represent the analog signals.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

Figure 1A:
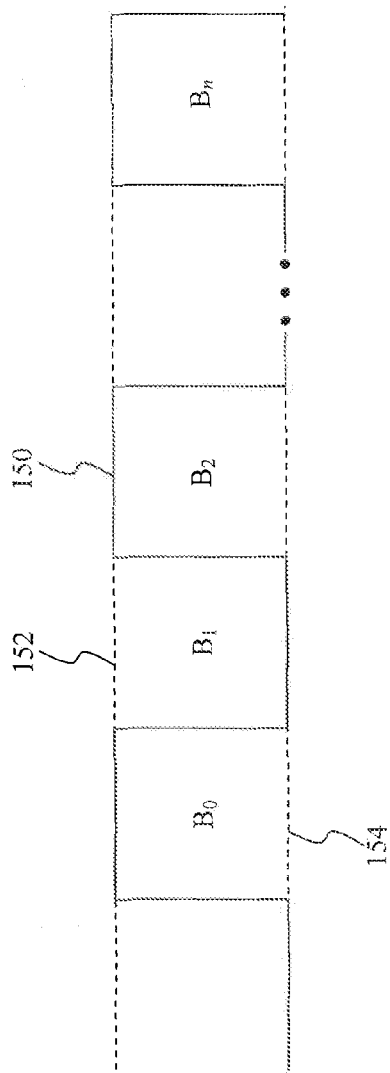
FIG. 1A illustrates a digital output provided by a pipeline analog-to-digital converter (ADC) according to an exemplary embodiment of the present disclosure.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

A Pipeline Analog-to-Digital Converter (ADC)

An analog-to-digital converter (ADC) converts an analog input from an analog signal domain to a digital signal domain to provide a digital output. The ADC selects a quantization level that corresponds to the analog input from among its various quantization levels and provides a codeword that represents the quantization level as the digital output. Typically, a difference between the analog input and the digital output is referred to as a quantization error. A pipeline ADC includes multiple ADCs, Whereby the quantization error from a former ADC is provided to a later ADC in the form of an analog residual signal. This later ADC then converts the analog residual signal from the former ADC to the digital signal domain.

A settling time of the pipeline ADC refers to a time required by one of the samples of the analog residual signal to achieve its steady state value before the pipeline ADC transitions to another sample of the analog residual signal. FIG. 1A illustrates a digital output provided by a pipeline analog-to-digital converter (ADC) according to an exemplary embodiment of the present disclosure. The pipeline ADC converts an analog input from an analog signal domain to a digital signal domain to provide a digital output 150. The digital output 150 includes samples $B_0$ through $B_n$ that collectively represent a digital approximation of a sampling of the analog input at a time $t_0$. The samples $B_0$ through $B_n$ transition between a first logic state corresponding to a logical one and a second logic state corresponding to a logical zero. The first logic state corresponds to a logical one steady state value of 152 and the second logic state corresponds to a logical zero steady state value of 154. The digital output 150 transitions from the logical zero steady state value of 154 to the logical one steady state value of 152 to form the sample $B_0$ then transitions from the logical one steady state value of 152 to the logical zero steady state value of 154 to form the sample $B_1$.

Figure 1B:
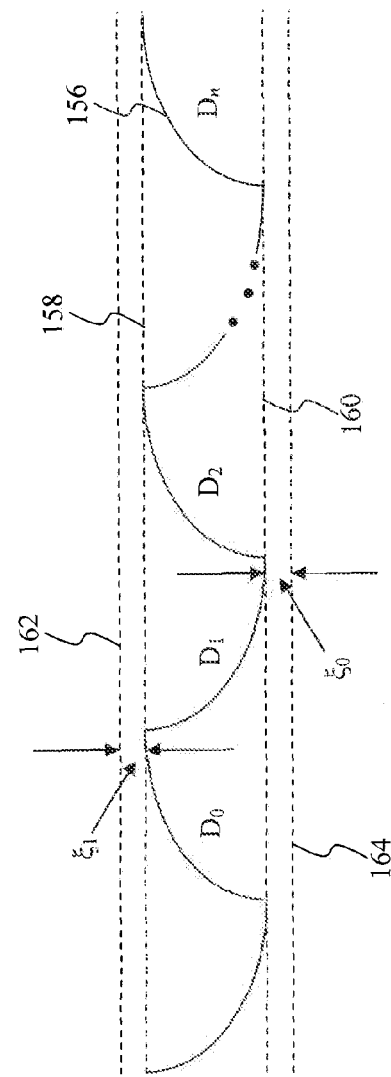
FIG. 1B illustrates an analog residual signal provided by the pipeline ADC according to an exemplary embodiment of the present disclosure.

FIG. 1B illustrates an analog residual signal provided by the pipeline ADC according to an exemplary embodiment of the present disclosure. The pipeline ADC converts an analog input from an analog signal domain to a digital signal domain and provides an analog residual signal 150. The analog residual signal 156 includes samples $D_0$ through $D_n$ that collectively represent a quantization error between an analog input and the digital output 150. The samples $D_0$ through $D_n$ transition between two analog levels 158 and 160.

However, in the case that the clock period of the pipeline ADC is smaller than the settling time to reach the steady state values, the analog residual signal 156 partially settles to the value of 158 before reaching the steady state value of 162 and/or partially settles to the value of 160 before reaching the steady state value of 164. A difference between the actual settled value of 158 and the steady state value of 162 can be referred to as a first settling error $\xi_1$ and a difference between the actual settled value of 160 and the steady state value of 164 can be referred to as a second settling error $\xi_2$.

The first settling error $\xi_1$ and/or the second settling error $\xi_2$ can be mathematically approximated as inter-sample interference (ISI) which is substantially similar to intersymbol interference which is often encountered in digital communications. The ISI represents a form of interference or distortion of a signal, such as the analog residual signal 156 to provide an example, in which one sample, such as the sample $D_0$ to provide an example, interferes and/or distorts other samples, such as the samples $D_2$ through $D_n$ to provide an example. Additionally, other non-linear interference or distortion as well as linear interference or distortion impressed onto the analog residual signal, such as coupling and gain error to provide an example, can also be mathematically approximated as ISI. Typically, the interference or distortion impressed onto the analog residual signal can be represented as a transfer function H(z). The transfer function H(z) represents a mathematically representation of the interference or distortion impressed onto one sample of the analog residual signal that can be mathematically approximated as being caused by other samples of the analog residual signal.

A Pipeline Analog-to-Digital Converter (ADC)

As discussed above, a pipeline ADC includes multiple ADCs, whereby the quantization error from a former ADC is provided to a later ADC in the form of an analog residual signal. Typically, imperfections within the ADCs can impress interference or distortion onto various analog residual signals of the pipeline ADC. The interference or distortion impressed onto these analog residual signals can be mathematically approximated as ISI. As a result, the interference or distortion impressed onto one sample of the analog residual signal can be characterized as being related to other samples of the analog residual signals. As such, the pipeline ADC can compensate for interference or distortion impressed onto the one sample of its analog residual signal by adjusting phases and/or amplitudes of other samples of the analog residual signal and removing these phase and/or amplitude adjusted samples from the one sample that is to be corrected.

Figure 2:
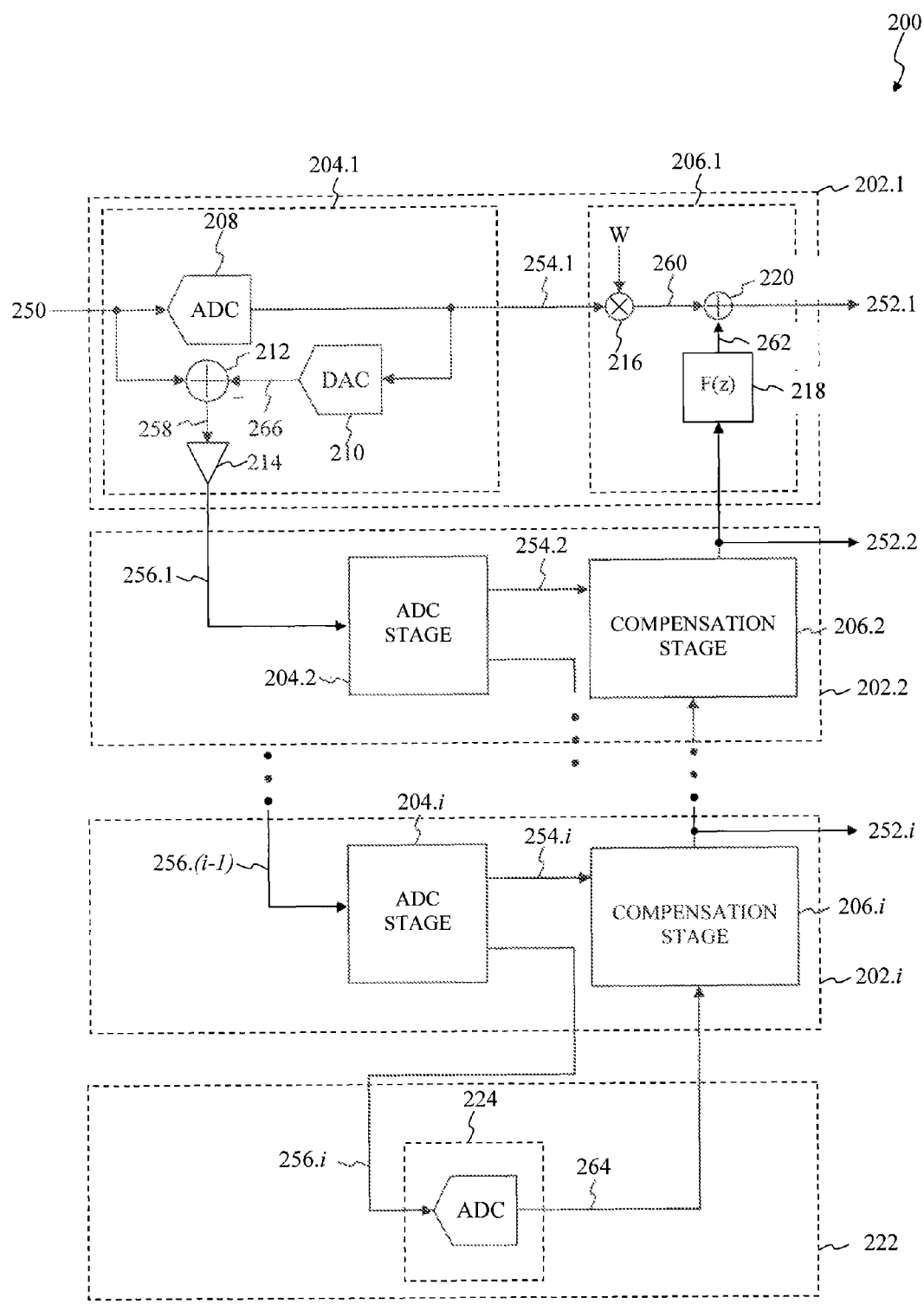
FIG. 2 illustrates a block diagram of a pipeline ADC according to an exemplary embodiment of the present disclosure.

FIG. 2 illustrates a block diagram of a pipeline ADC according to an exemplary embodiment of the present disclosure. A pipeline ADC 200 converts an analog input 250 from the analog signal domain to the digital signal domain to provide digital outputs 252.1 through 252.i. A number of digital outputs within the digital outputs 252.1 through 252.i represents a resolution of the pipeline ADC 200. Typically, more digital outputs within the digital outputs 252.1 through 252.i indicate a higher resolution for the pipeline ADC 200. A lower resolution may include lesser digital outputs within the digital outputs 252.1 through 252.i or some of the digital outputs 252.1 through 252.i can be unused.

The pipeline ADC 200 includes multiple ADCs to convert the analog input 250 from the analog signal domain to the digital signal domain. As the analog input 250 is being converted into the digital signal domain, the multiple ADCs provide analog residual signals that represent a difference between their corresponding analog input and their corresponding digital output. Various imperfections within the multiple ADCs can impress interference or distortion onto their corresponding analog residual signals. The pipeline ADC 200 compensates for the interference or distortion impressed onto the analog residual signals of the multiple ADCs before providing the digital outputs 252.1 through 252.$i$. The pipeline ADC 200 includes ADC modules 202.1 through 202.$i$ and an ADC module 222 that are configured and arranged to form a pipeline ADC.

The ADC modules 202.1 through 202.$i$ convert their corresponding analog inputs from the analog signal domain to the digital signal domain to provide the digital outputs 252.1 through 252.$i$. The ADC modules 202.1 through 202.1 additionally compensate for interference or distortion that is impressed onto the digital outputs 252.1 through 252.$i$ that is caused by imperfections within these ADC modules. The ADC modules 202.1 through 202.$i$ can be configured and arranged such that the ADC module 202.1 provides a most significant bit (MSB) of the digital outputs 252.1 through 252.$i$ and the ADC module 202.$i$ provides a least significant bit (LSB) of the digital outputs 252.1 through 252.$i$. In these situations, the ADC module 202.1 converts the analog input 250 from the analog signal domain to the digital signal domain to provide the digital outputs 252.1 to form the MSB of the digital outputs 252.1 through 252.$i$ while the ADC module 202.$i$ forms the LSB of the digital outputs 252.1 through 252.$i$.

The ADC modules 202.1 through 202.$i$ include a corresponding ADC stage 204.1 through 204.$i$ and a corresponding compensation stage 206.1 through 206.$i$. The ADC stages 204.1 through 204.$i$ convert their corresponding analog inputs from the analog signal domain to the digital signal domain to provide digital output signals 254.1 through 254.$i$. The compensation stages 206.1 through 206.$i$ compensate for interference or distortion that is impressed onto residual analog signals 256.1 through 256.$i$ that represent differences between their corresponding analog inputs and their corresponding digital output signals 254.1 through 254.$i$. which results from imperfections within the ADC stages 204.1 through 204.$i$.

The ADC stages 204.1 through 204.$i$ convert their corresponding analog inputs from the analog signal domain to the digital signal domain to provide the digital output signals 254.1 through 254.$i$. Additionally, the ADC stages 204.1 through 204.$i$ provide the residual analog signals 256.1 through 256.$i$ that represent differences between their corresponding analog inputs and their corresponding digital output signals 254.1 through 254.$i$. The ADC stages 204.2 through 204.$i$ can be characterized as converting corresponding residual analog signals 256.1 through 256.$i$ from previous ADC modules 202.1 through 202.$i$ from the analog signal domain to the digital signal domain. For example, the ADC stage 204.1 provides the residual analog signal 256.1 to the ADC module 202.2. Thereafter, the ADC stage 204.2 of the ADC module 202.2 converts the residual analog signal 256.1 from the analog signal domain to the digital signal domain to provide the digital output signal 254.2. Each of the ADC stages 204.3 through 204.$i$ of remaining ADC modules 202.3 through 202.$i$ convert the residual signal 256.2 through 256.($i$-1) provided by a prior ADC module 202.2 through 202.($i$-1) and provide another residual signal 256.3 through 256.$i$ to a subsequent ADC module 202.2 through 202.$i$. and/or the ADC module 222.

In an exemplary embodiment, the ADC stages 204.1 through 204.$i$ are implemented in a substantially similar manner; therefore, only the ADC stage 204.1 is to be discussed in further detail. However, this exemplary embodiment is not limiting, those skilled in the relevant art(s) will recognize that other implementations are possible without departing from the spirit and scope of the present disclosure. The ADC stage 204.1 includes an ADC 208, a digital-to-analog converter (DAC) 210, a combination module 212 and an optional amplifier module 214.

The ADC 208 converts the analog input 250 from the analog signal domain to the digital signal domain to provide the digital output signal 254.1.

The ADC 208 selects a quantization level that corresponds to the analog input 250 from among its various quantization levels and provides a codeword that represents the quantization level as the digital output signal 254.1.

The DAC 210 converts the digital output signal 254.1 from the digital signal domain to the analog signal domain to provide an analog output 266.

The combination module 212 combines the analog input 250 and the analog output 266 to provide a residual analog signal 258. The residual analog signal 258 represents a difference between the analog input 250 and the digital output signal 254.1. In other words, the residual analog signal 258 represents a difference between the analog input 250 and the quantization level that was selected by the ADC 208 to provide the codeword as the digital output signal 254.1.

The optional amplifier module 214 amplifies the residual analog signal 258 to provide the residual analog signal 256.1. Typically, the ADC 208 is configured and arranged such that the analog input 250 is within its dynamic range. A ratio between a most miniscule nonzero quantization level and a maximum quantization level can be referred to as a dynamic range of the ADC 208. Generally, a dynamic range of the ADC modules 202.1 is determined by a dynamic range of the ADC 208 which is determined such that a maximum value of the analog input 250 is less than or equal to the maximum quantization level, and/or a minimum value of the analog input 250 is greater than or equal to the minimum quantization level. The optional amplifier module 214 amplifies the residual analog signal 258 such that its maximum value is less than or equal to a maximum quantization level of a subsequent ADC modules 202.2 through 202.$i$ and its minimum value is greater than or equal to a minimum quantization level of the subsequent ADC modules 202.2 through 202.$i$. Additionally, imperfections within the ADC 208, the DAC 210, the combination module 212 and/or the optional amplifier module 214 can impress interference or distortion onto the residual analog signal 256.1.

The compensation stages 206.1 through 206.$i$ compensate for interference or distortion impressed onto the residual analog signals 256.1 through 256.$i$ by the impairments within the ADC stages 202.1 through 202.1. The interference or distortion impressed onto the residual analog signals 256.1 through 256.$i$ can be mathematically approximated as ISI and can be represented as transfer functions $H_1(z)$ through $H_i(z)$. The transfer function $H_1(z)$ through $H_i(z)$ represent mathematically representations of the interference or distortion impressed onto one sample of the residual analog signals 256.1 through 256.$i$ that can be mathematically approximated as being caused by other samples of the residual analog signals 256.1 through 256.$i$. Prior compensation stages 206.1 through 206.$i$ can compensate for interference or distortion impressed onto their corresponding residual analog signals 256.1 through 256.$i$ by adjusting phases and/or amplitudes of digital output signals 252.1 through 252.$i$ of subsequent compensation stages 206.1 through 206.$i$ and/or a digital output signal 264 and adding these phase and/or amplitude adjusted digital output to one of the digital output signals 254.1 through 254.$i$. For example, the compensation stage 206.1 can compensate for interference or distortion impressed onto the residual analog signal 256.1 by the ADC stage 204.1 by adjusting a phase and/or an amplitude of the digital output 252.2 and adding this phase and/or amplitude adjusted digital output 252.2 to the digital output signal 254.1.

In an exemplary embodiment, the compensation stages 206.1 through 206.*i* are implemented in a substantially similar manner; therefore, only the compensation stage 206.1 is to be discussed in further detail. However, this exemplary embodiment is not limiting, those skilled in the relevant art(s) will recognize that other implementations are possible without departing from the spirit and scope of the present disclosure.

The compensation stage 206.1 includes a multiplication module 216, an adaptive filter module 218, and a combination module 220. The multiplication module 216 multiplies the digital output signal 254.1 by a weighting factor W to provide a weighted digital output signal 260. The weighting factor W is from among multiple weighting factors $W_1$ through $W_n$ whereby one or more weighting factor from among the multiple weighting factors $W_1$ through $W_n$ corresponds to each of the compensation stages 206.1 through 206.*i*. Typically, the weighting factors $W_1$ through $W_n$ are selectively chosen to normalize the digital output signals 254.1 through 254.*i*.

The adaptive filter module 218 adjusts a phase and/or an amplitude of the digital output signal 252.2 in accordance with a transfer function $$F(z) = \frac{1}{H(z)}$$

to compensate for the interference or distortion impressed onto the residual analog signal 256.1 by the ADC stage 204.1 to provide an impairment compensated signal 262. The transfer function F (z) is from among multiple transfer functions $$F_1(z) = \frac{1}{H_1(z)}$$

through $$F_i(z) = \frac{1}{H_i(z)},$$

whereby one or more transfer functions from among the multiple transfer functions $$F_1(z) = \frac{1}{H_1(z)}$$

through $$F_i(z) = \frac{1}{H_i(z)}$$

corresponds to each of the compensation stages 206.1 through 206.*i*. The impairment compensated signal 262 represents an estimate of the residual analog signal 256.1 having the interference or distortion impressed onto this residual analog signal by the ADC stage 204.1 removed.

The adaptive filter module 218 represents an adaptive filter having one or more adaptive filtering taps that adaptively adjust its transfer function $$F(z) = \frac{1}{H(z)}$$

by adjusting one or more coefficients, or sets of coefficients, using an adaptive filtering algorithm such as the Least Mean Squared (LMS), the Recursive Least Squares (RLS), the Minimum Mean Squared Error (MMSE) algorithms or any other equivalent algorithm that will be apparent to those skilled in the relevant art(s) without departing from the spirit and scope of the present disclosure.

In an exemplary embodiment, the adaptive filter module 218 can be implemented using a multi-tap finite impulse response (FIR) filter. Generally, the multi-tap FIR filter can be represented as:

$$y[n] = \sum_{i=0}^{N} b_i x[n-i], \tag{2}$$

where x[n] represents an input of the multi-tap FIR filter, y[n] represents an output of the multi-tap FIR filter, b represents the one or more coefficients, or sets of coefficients, that form the impulse response of the multi-tap FIR filter, and N represents an order of the multi-tap FIR filter. For example, a two-tap (N=1) FIR filter can be implemented to compensate for the ISI due to the first order settling from two consecutive samples of the residual analog signals 256.1 through 256.*i*. As another example, a three-tap (N=2) FIR filter can be implemented to compensate for the NI due to the second-order settling from three consecutive samples of residual analog signals 256.1 through 256.1. Also, the multi-tap FIR filter can include one or more feed-forward taps to compensate for ISI due to the feed-forward effect of the residual analog signals 256.1 through 256.1. Generally, this multi-tap FIR filter with feed-forward taps can be represented as:

$$y[n] = \sum_{k=1}^{N} a_k x[n+k] + \sum_{i=0}^{N} b_i x[n-i], \tag{3}$$

where M represents an order of the feed-forward taps of the feed-forward tap multi-tap FIR filter and $a_k$ represents one or more coefficients, or sets of coefficients, that form a feed forward portion of the impulse response of the feed-forward tap multi-tap FIR filter.

The combination module 220 combines the weighted digital output signal 260 and the impairment compensated signal 262 to provide the digital output 252.1. Specifically, the combination module 220 adds the impairment compensated signal 262 to produce a high resolution digital output as the digital output 252.1.

The ADC module 222 converts the residual analog signal 256.*i* from the analog signal domain to the digital signal domain to provide the digital output signal 264. The ADC module 222 includes an ADC 224 to convert the residual analog signal 256.*i* from the analog signal domain to the digital signal domain.

Various Adaptive Filter Modules that can be Implemented within the Pipeline ADC

The ADC stages 204.1 through 204.*i* can include multiple signal paths operating in a time multiplexed manner. In addition to compensating for imperfections with the ADC stages 204.1 through 204.*i*, other embodiments of the compensation stages 206.1 through 206.*i* can compensate for various gain mismatches between two or more of the multiple signal paths in one of the ADC stages 204.1 through 204.*i* and/or various offsets between the two or more of the multiple signal paths in one of the ADC stages 204.1 through 204.*i*. These other embodiments of the compensation stages 206.1 through 206.*i* combine various gain and/or offset compensation values with the digital outputs 252.1 through 252.*i* and/or the digital output signal 264 to compensate for the various gain mismatches and/or offsets between two or more of the multiple signal paths in one of the ADC stages 204.1 through 204.*i*.

Figure 3:
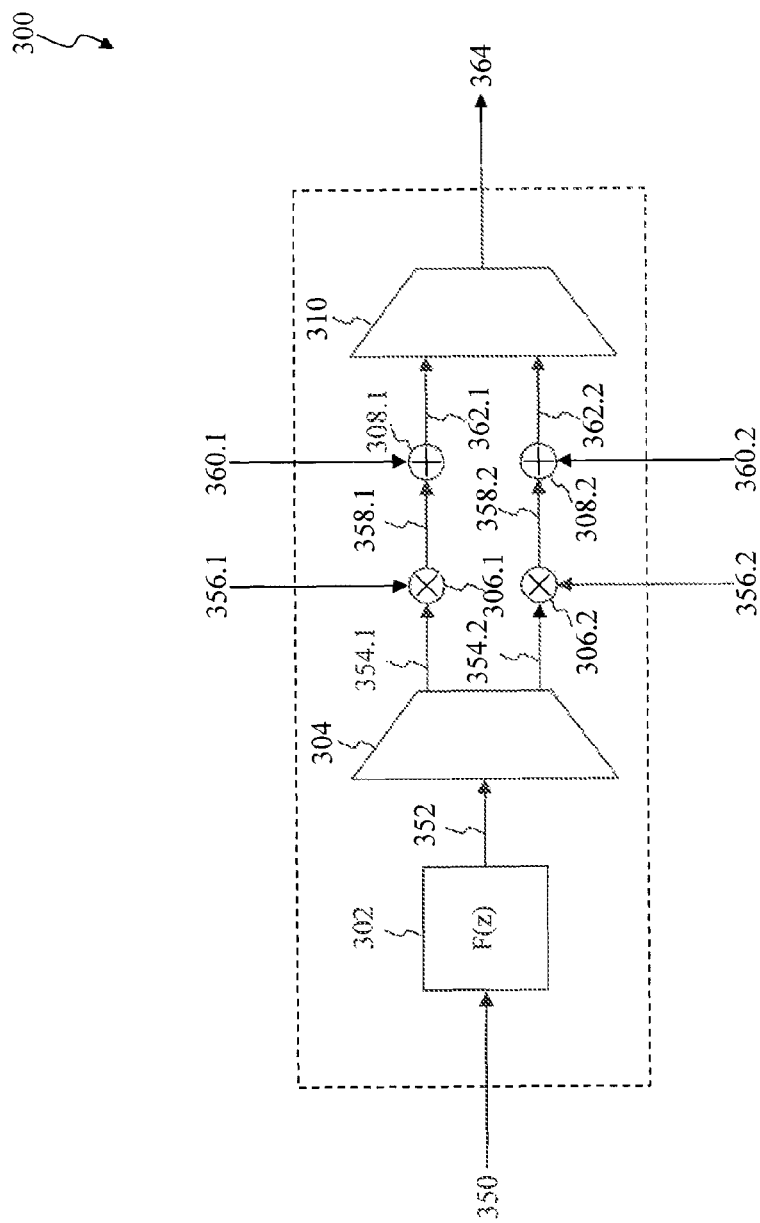
FIG. 3 illustrates a block diagram of first adaptive filter module that can be implemented within the pipeline ADC according to an exemplary embodiment of the present disclosure.

FIG. 3 illustrates a block diagram of first adaptive filter module that can be implemented within the pipeline ADC according to an exemplary embodiment of the present disclosure. An adaptive filter module 300 can compensate the interference or distortion impressed onto a residual analog signal, such as one of the residual analog signals 256.1 through 256.*i* to provide an example, that is caused by imperfections within one or more ADC stages, such as one or more paths in one of the ADC stages 204.1 through 204.*i* to provide an example. The adaptive filter module 300 can compensate for gain mismatches between two or more of the multiple signal paths in one of the ADC stages and/or various offsets between the two or more of the multiple signal paths in one of the ADC stages. The adaptive filter module 300 includes an ISI compensation module 302, a demultiplexing module 304, first and second multiplication modules 306.1 and 306.2, first and second combination modules 308.1 and 308.2, and a multiplexing module 310. The adaptive filter module 300 can represent an exemplary embodiment of the adaptive filter module 218.

The ISI compensation module 302 can operate upon a digital input 350, such as one of the digital outputs 252.1 through 252.*i* to provide an example, in accordance with transfer functions F(z) to provide the ISI compensated digital output 352 in a substantially similar manner as the adaptive filter module 218 as discussed above to provide an ISI compensated digital output 352.

A gain mismatch between two or more of the multiple signal paths in one of the various ADC stages and/or an offset between the two or more of the multiple signal paths in one of the various ADC stages can differ between the two or more of the multiple signal paths. The demultiplexing module 304 provides the ISI compensated digital output 352 to a first signal path processing branch and/or to a second signal path processing branch. The first signal path processing branch includes the first multiplication module 306.1 and the first combination module 308.1 and the second signal path processing branch includes the second multiplication module 306.2 and the second combination module 308.2.

The first multiplication module 306.1 multiplies a first signal path digital output 354.1 by a first signal path gain compensation value 356.1 to provide a first signal path gain compensated digital output 358.1. Similarly, the second multiplication module 306.2 multiplies a second signal path digital output 354.2 by a second signal path gain compensation value 356.2 to provide a second signal path gain compensated digital output 358.2. The first combination module 308.1 combines the first signal path gain compensated digital output 358.1 with a first signal path offset compensation value 360.1 to provide a first signal path offset compensated digital output 362.1. Similarly, the second combination module 308.2 combines the second signal path gain compensated digital output 358.2 with a second signal path offset compensation value 360.2 to provide a second signal path offset compensated digital output 362.2.

The multiplexing module 310 provides the first signal path offset compensated digital output 362.1 or the second signal path offset compensated digital output 362.2 as a compensated digital output 364.

Figure 4:
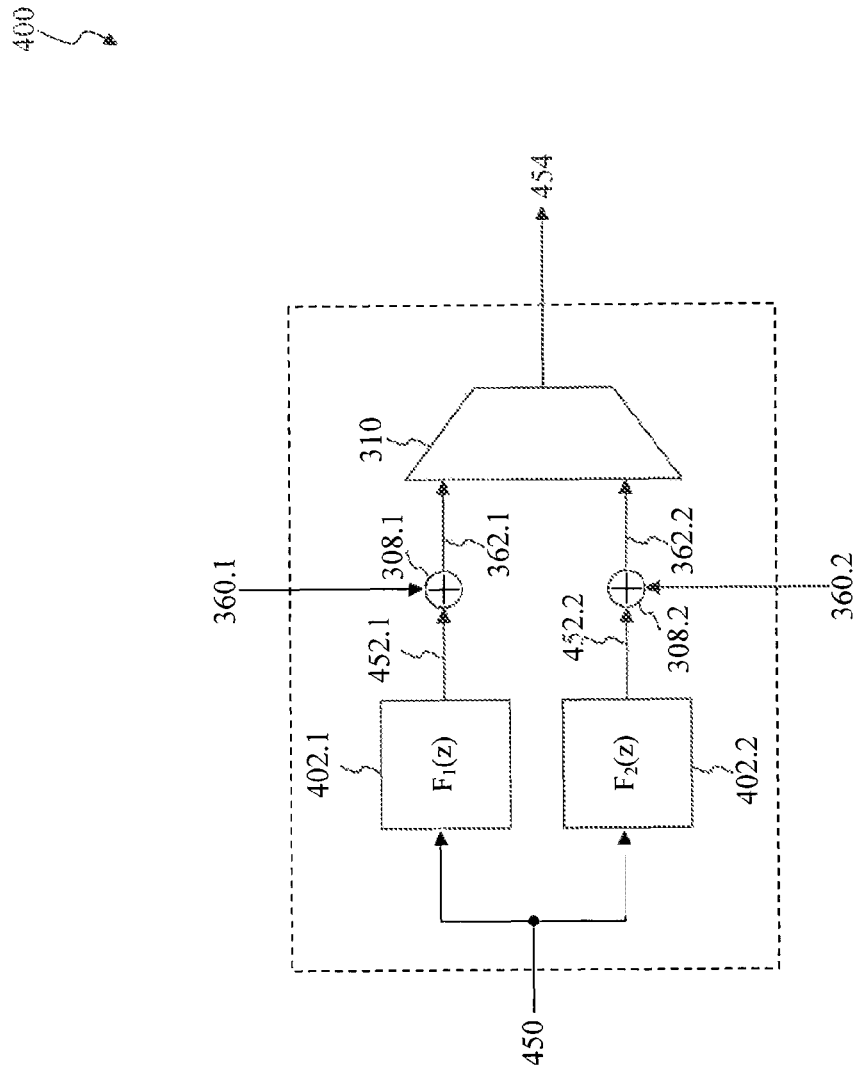
FIG. 4 illustrates a block diagram of a second adaptive filter module that can be implemented within the pipeline ADC according to an exemplary embodiment of the present disclosure.

FIG. 4 illustrates a block diagram of a second adaptive filter module that can be implemented within the pipeline ADC according to an exemplary embodiment of the present disclosure. An adaptive filter module 400 can compensate for the interference or distortion impressed a residual analog signal, such as one of the residual analog signals 256.1 through 256.*i* to provide an example, that is caused by imperfections within one or more ADC stages, such as one or more of the ADC stages 204.1 through 204.*i* to provide an example. The adaptive filter module 400 can compensate for gain mismatches between two or more of the ADC stages. The adaptive filter module 400 includes first and second ISI compensation stages 402.1 and 402.2, the first and the second combination modules 308.1 and 308.2, and the multiplexing module 310. The adaptive filter module 400 can represent an exemplary embodiment of the adaptive filter module 218.

The first and second ISI compensation stages 402.1 and 402.2 can operate upon a digital input 450 to provide ISI compensated digital outputs 452.1 and 452.2. The first and second ISI compensation stages 402.1 and 402.2 can operate upon the digital input 450 in accordance with a first signal path transfer function $F_1(z)$ to provide the ISI compensated digital output 452.1 and a second signal path transfer function $F_2(z)$ to provide the ISI compensated digital output 452.2, respectively, in a substantially similar manner as the adaptive filter module 218 as discussed above. Typically, the first signal path transfer function $F_1(z)$ represents a transfer function that can be used to compensate for the interference or distortion impressed onto the residual analog signal by the first signal path that includes a first gain error and the second signal path transfer function $F_2(z)$ represents a transfer function that can be used to compensate for the interference or distortion impressed onto the residual analog signal by the second signal path that includes a second gain error.

The first combination module 308.1 combines the ISI compensated digital output 452.1 with the first signal path offset compensation value 360.1 to provide the first signal path offset compensated digital output 362.1. Similarly, the second combination module 308.2 combines the ISI compensated digital output 452.2 with the second signal path offset compensation value 360.2 to provide the second signal path offset compensated digital output 362.2.

The multiplexing module 310 provides the first signal path offset compensated digital output 362.1 or the second signal path offset compensated digital output 362.2 as a compensated digital output 464.

Calibration of Various Parameters of the Pipeline ADC

As discussed above, a pipeline ADC, such as the pipeline ADC 200 to provide an example, uses one or more coefficients, or sets of coefficients, and, optionally, various weighting factors, various gain compensation parameters, and/or various offset compensation parameters to compensate for interference or distortion caused by imperfections within its various ADC modules. The pipeline ADC can determine these coefficients, or sets of coefficients, as well as these optional weighting factors and/or gain and/or offset compensation parameters using a calibration routine.

Generally, the calibration routine sequentially calibrates each of the various ADC modules of the pipeline ADC using an adaptive algorithm such as the Least Mean Squared (LMS), the Recursive Least Squares (RLS), the Minimum Mean Squared Error (MMSE) algorithms or any other equivalent algorithm that will be apparent to those skilled in the relevant art(s) without departing from the spirit and scope of the present disclosure. In an exemplary embodiment, the calibration routine starts by calibrating one of the various ADC modules that corresponds to a least significant bit (LSB). The calibration routine thereafter sequentially calibrates each of the various ADC modules until calibration of one of the various ADC stages that corresponds to a most significant bit (MSB) is complete.

Figure 5A:
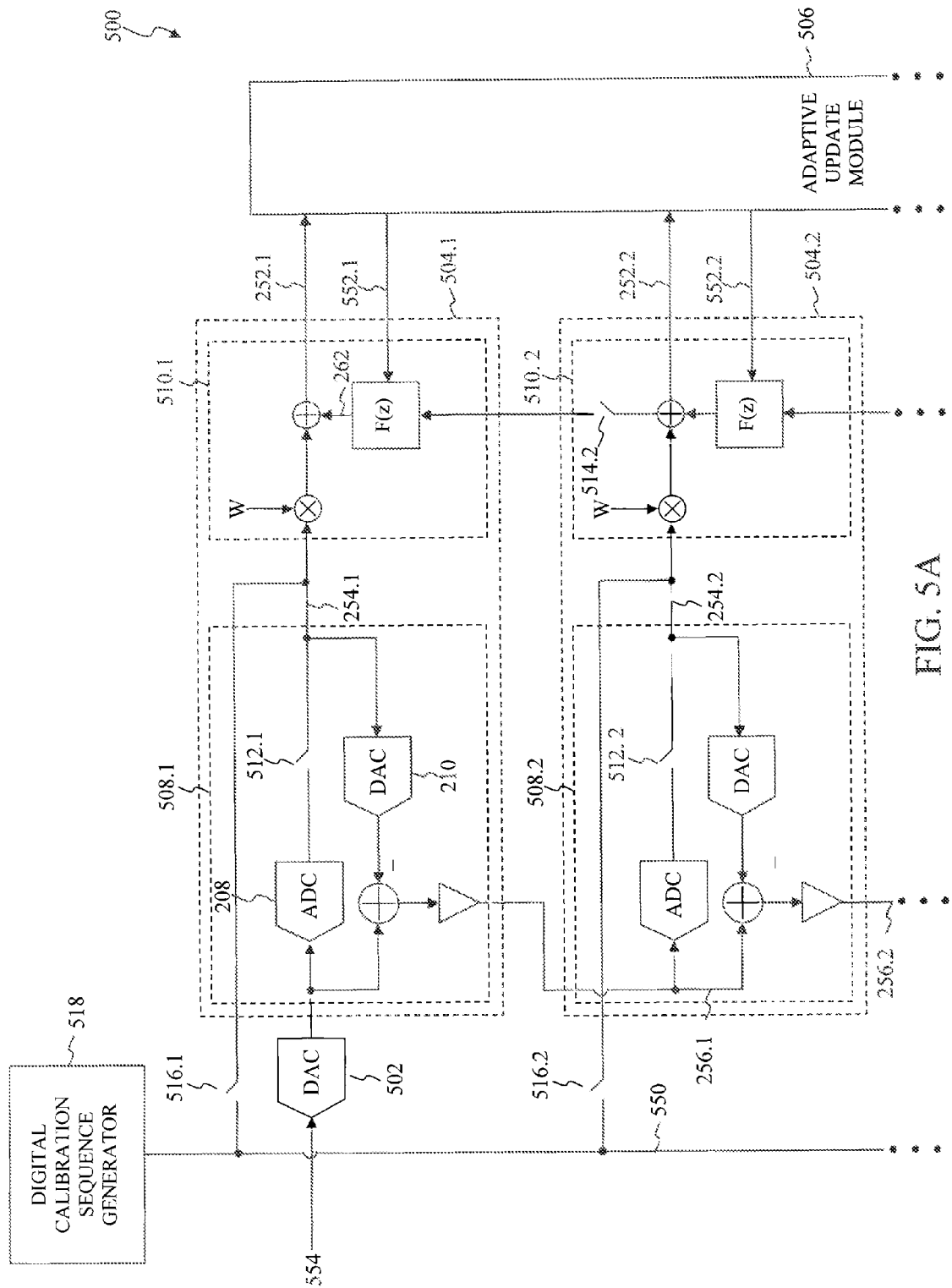
FIG. 5A and FIG. 5B illustrate a block diagram of a second pipeline ADC according to an exemplary embodiment of the present disclosure.
Figure 5B:
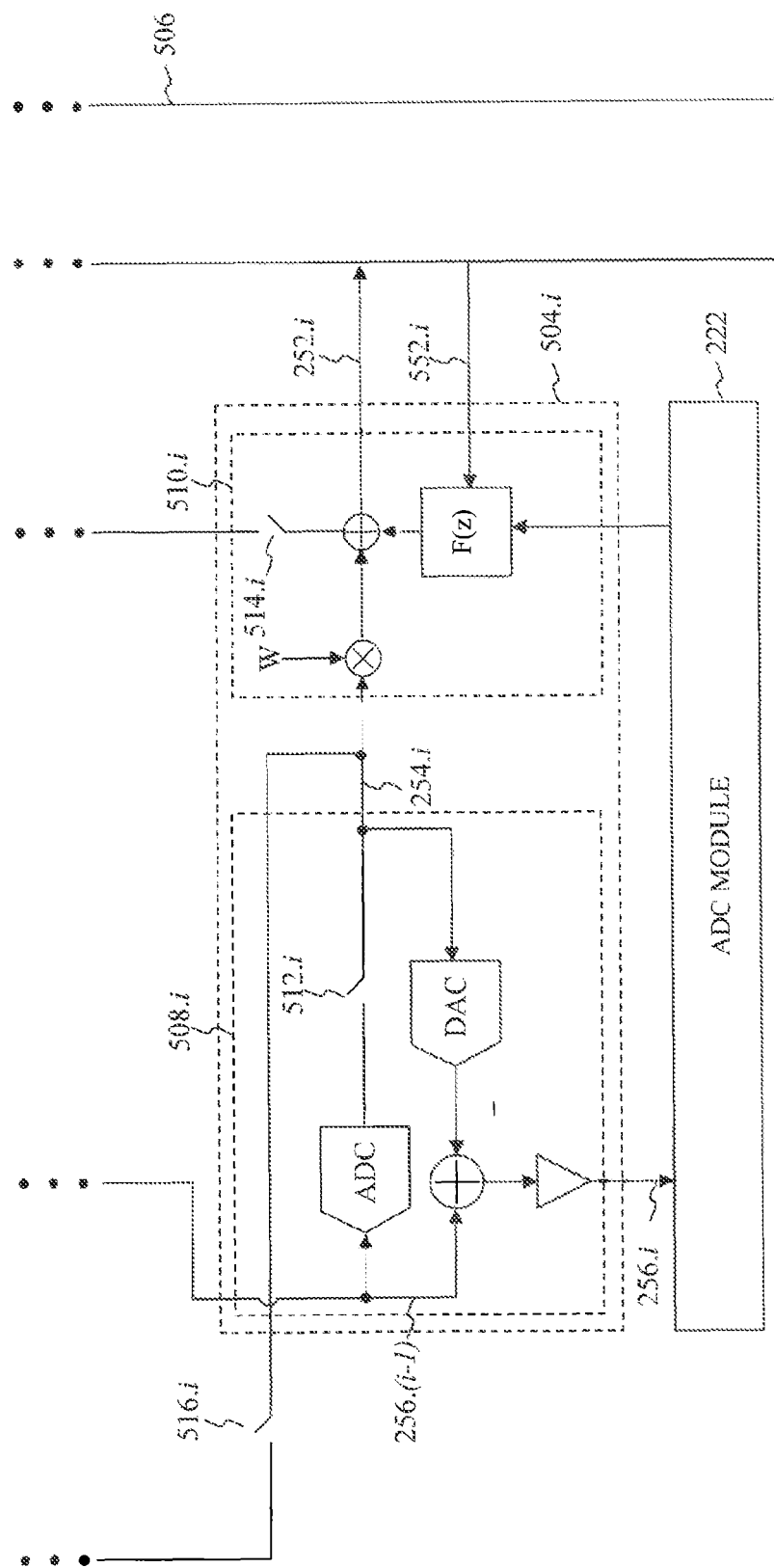

FIG. 5A and FIG. 5B illustrate a block diagram of a second pipeline ADC according to an exemplary embodiment of the present disclosure. A pipeline ADC 500 uses one or more coefficients, or sets of coefficients, and, optionally, various weighting factors to compensate for interference or distortion caused by imperfections within its various ADC stages. Optionally, the pipeline ADC 500 can use various gain and/or offset compensation parameters to compensate for gain mismatch between two or more of the multiple signal paths in one of the various ADC stages and/or offset between two or more of the multiple signal paths in one of the various ADC stages. The pipeline ADC 500 can determine these coefficients, or sets of coefficients, as well as these optional gain and/or offset compensation parameters using a sequential calibration routine. The pipeline ADC 500 includes the ADC module 222, a calibration digital-to-analog converter (DAC) 502, ADC modules 504.1 through 504.$i$, an adaptive update module 506, calibration switches 516.1 through 516.$i$, and a digital calibration sequence generator 518.

The calibration DAC 502 converts a digital codeword 554 to provide a direct current (DC) bias the analog input 250 to the pipeline ADC 500.

The digital calibration sequence generator 518 generates a digital calibration sequence 550. The digital calibration sequence 550 represents a known digital sequence, a random digital sequence, a pseudo-random digital sequence, or any other suitable digital sequence that will be apparent to those skilled in the relevant art(s) without departing from the spirit and scope of the present disclosure. The calibration switches 516.1 through 516.$i$ couple the digital calibration sequence 550 to a corresponding one of the ADC modules 504.1 through 504.$i$ when in a conducting, or "ON", state or decouple the digital calibration sequence 550 from the corresponding one of the ADC modules 504.1 through 504.$i$ when in a non-conducting, or "OFF", state. Although a single digital calibration sequence generator 518 is shown in FIG. 5A, those skilled in the relevant art(s) will recognize that more than one digital calibration sequence generator 518 can be used to generate different digital calibration sequences 550 for at least some of the ADC modules 504.1 through 504.$i$.

The ADC modules 504.1 through 504.$i$ convert their corresponding analog inputs from the analog signal domain to the digital signal domain to provide the digital outputs 252.1 through 252.$i$ and, optionally, compensate for interference or distortion that is impressed onto the residual analog signals 256.1 through 256.$i$ that is caused by imperfections within these ADC modules in a substantially similar as the ADC modules 202.1 through 202.$i$. Therefore, only differences between the ADC modules 504.1 through 504.$i$ and the ADC modules 202.1 through 202.$i$ are to be described in further detail.

The ADC modules 504.1 through 504.$i$ include a corresponding ADC stage 508.1 through 508.$i$ and a corresponding compensation stage 510.1 through 510.1. The ADC stages 508.1 through 508.$i$ convert their corresponding analog inputs from the analog signal domain to the digital signal domain to provide the digital output signals 254.1 through 254.$i$ in a substantially similar manner as the ADC stages 202.1 through 202.$i$ in a normal mode of operation. The ADC stages 508.1 through 508.$i$ additionally include ADC stage isolation switches 512.1 through 512.$i$. The ADC stage isolation switches 512.1 through 512.$i$ couple the ADC 208 to the DAC 210 when in conducting, or "ON", states in the normal mode of operation and decouple the ADC 208 from the DAC 210 when in non-conducting, or "OFF", states in a calibration mode of operation. When in the calibration mode of operation, the digital outputs 252.1 through 252.$i$ are no longer provided by the ADC stages 508.1 through 508.$i$ when the ADC stage isolation switches 512.1 through 512.$i$ are in the non-conducting states. Rather, the digital calibration sequence 550 is provided to the ADC stages 508.1 through 508.$i$ and the compensation stages 510.1 through 510.$i$ depending upon whether the calibration switches 516.1 through 516.$i$ are in their conducting or non-conducting states.

The compensation stages 510.1 through 510.$i$ compensate for interference or distortion that is impressed onto the residual analog signals 256.1 through 256.$i$ that is caused by imperfections within the ADC stages 508.1 through 508.$i$ in a substantially similar as the compensation stages 206.1 through 206.1 in the normal mode of operation. The compensation stages 510.2 through 510.$i$ additionally include compensation stage isolation switches 514.2 through 514.$i$. The compensation stage isolation switches 514.2 through 514.$i$ couple the combination module 220 of a subsequent compensation stage 510.2 through 510.$i$ to the adaptive filter module 218 of a prior compensation stage 510.1 through 510.($i$-1) when in conducting, or "ON", states in the normal mode of operation and decouple the combination module 220 of the subsequent compensation stage 510.2 through 510.$i$ to the adaptive filter module 218 of the prior compensation stage 510.1 through 510.($i$-1) when in non-conducting, or "OFF", states in the calibration mode of operation.

When the ADC stage isolation switches 512.1 through 512.$i$ and/or the compensation stage isolation switches 514.2 through 514.$i$ for a corresponding one of the ADC modules 504.1 through 504.$i$ are configured to be in their non-conducting states, the digital calibration sequence 550 drives the DAC 210 to generate the residual analog signal 256.1 through 256.$i$, in which the interference or distortion may be impressed onto the calibration sequence 550. The impairment compensated signal 262 for that ADC module 504.1 through 504.$i$ represents a negative approximation of the calibration sequence 550 with an estimate of the interference or distortion removed from the signal. In this situation, the combination module 220 subtracts the digital calibration sequence 550 with an estimate of the calibration sequence in the impairment compensated signal 262 to produce an error signal as the digital output 252.1 through 252.$i$ provided by that ADC module 504.1 through 504.$i$. The adaptive update module 506 provides compensation parameters 552.1 through 552.$i$ that minimize this error.

The compensation parameters 552.1 through 552.$i$ can include the one or more coefficients, or sets of coefficients, the various weighting factors, the various gain compensation parameters, and/or the various offset compensation parameters that are used by the compensation stages 510.1 through 510.$i$ to compensate for interference or distortion caused by imperfections within the ADC stages 508.1 through 508.$i$. The adaptive update module 506 determines the compensation parameters 552.1 through 552.$i$ using an adaptive algorithm such as the Least Mean Squared (LMS), the Recursive Least Squares (RLS), the Minimum Mean Squared Error (MMSE) algorithms or any other equivalent algorithm that will be apparent to those skilled in the relevant art(s) without departing from the spirit and scope of the present disclosure.

Figure 6:
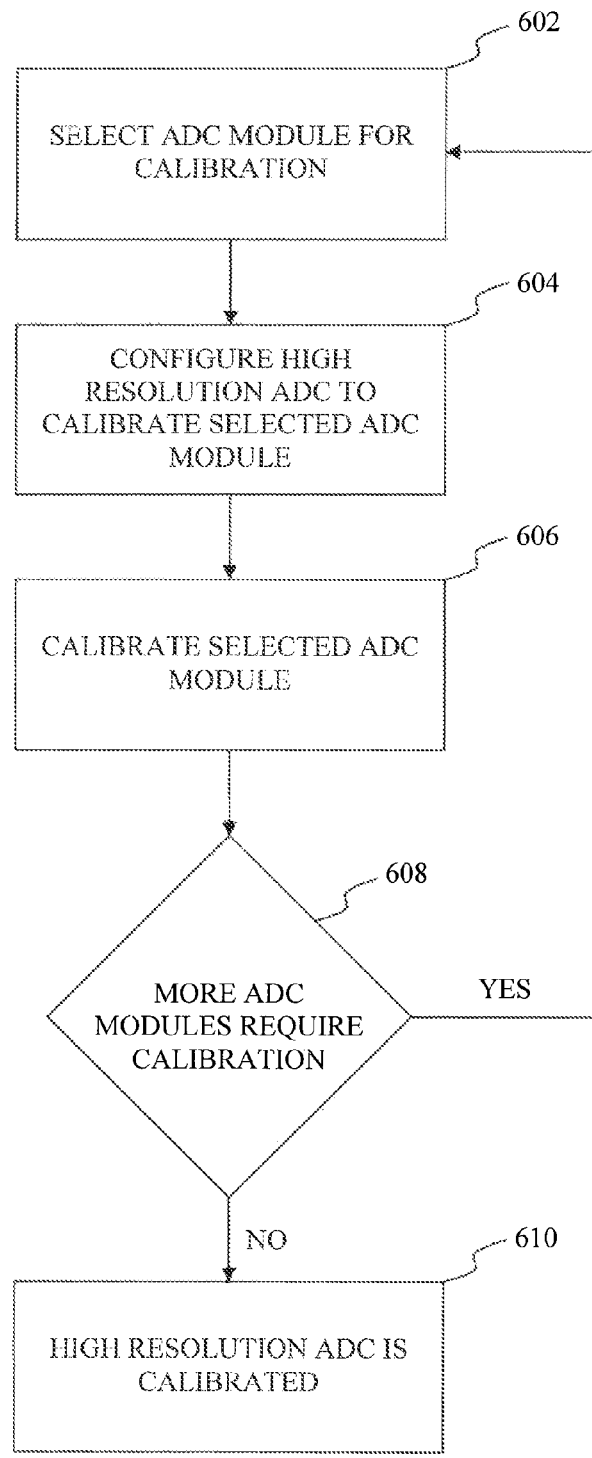
FIG. 6 is a flowchart of exemplary operational steps of a calibration routine that can be implemented by the second pipeline ADC according to an exemplary embodiment of the present disclosure.

FIG. 6 is a flowchart of exemplary operational steps of a calibration routine that can be implemented by the second pipeline ADC according to an exemplary embodiment of the present disclosure. The disclosure is not limited to this operational description. Rather, it will be apparent to persons skilled in the relevant art(s) from the teachings herein that other operational control flows are within the scope and spirit of the present disclosure. The following discussion describes the steps in FIG. 6.

At step 602, the operational control flow selects an ADC module of a pipeline ADC, such as one of the ADC modules 504.1 through 504.$i$ of the pipeline ADC 500 to provide an example, for calibration. Typically, the operational control flow sequentially selects from among the ADC modules starting with the ADC module that corresponds to a least significant bit (LSB) of an output of the pipeline ADC, such as the digital output 252.$i$ to provide an example, and finishing with the ADC module that corresponds to a most significant bit (MSB) of the output of the pipeline ADC, such as the digital output 252.$i$ to provide an example.

At step 604, the operational control flow configures the pipeline ADC to enable calibration of the ADC module selected in step 602. Typically, the operational control flow configures one or more switches, such as one or more of the ADC stage isolation switches 512.1 through 512.$i$, one or more of the compensation stage isolation switches 514.2 through 514.$i$ and/or one or more of the calibration switches 516.1 through 516.$i$ to enable calibration of the ADC module selected in step 602. The operational control flow configures the ADC stage isolation switch 512.1 through 512.$i$ and/or the compensation stage isolation switch 514.2 through 514.$i$ that correspond to the ADC module selected in step 602 to be in their non-conducting states. The operational control flow configures the calibration switch 516.1 through 516.$i$ that corresponds to the ADC module selected in step 602 to be in its conducting state. The operational control flow configures the ADC stage isolation switches 512.1 through 512.$i$, and/or the compensation stage isolation switches 514.2 through 514.$i$ that correspond to other ADC modules of the pipeline ADC to be in their conducting states. The operational control flow configures the calibration switches 516.1 through 516.$i$ that correspond to other ADC modules of the pipeline ADC to be in their non-conducting states.

At step 606, the operational control flow calibrates the ADC module selected in step 602. The operational control flow provides a digital calibration sequence, such as the digital calibration sequence 550 to provide an example, as an input to the ADC module selected in step 602. The digital calibration sequence is processed by the ADC module selected in step 602 to provide an output signal, such as one of the residual analog signals 256.1 through 256.$i$ to provide an example, that is impressed with interference or distortion caused by imperfections within the ADC module selected in step 602. The operational control flow then estimates and compensates for the interference or distortion that is impressed upon the output signal using compensation parameters, such as one of the compensation parameters 552.1 through 552.$i$ to provide an example, and compares this compensated signal to the digital calibration sequence to provide an error signal. The operational control flow then continuously adjusts the compensation parameters to minimize the error signal using an adaptive algorithm such as the Least Mean Squared (LMS), the Recursive Least Squares (RLS), the Minimum Mean Squared Error (MMSE) algorithms or any other equivalent algorithm that will be apparent to those skilled in the relevant art(s) without departing from the spirit and scope of the present disclosure.

At step 608, the operational control flow determines whether all of the ADC modules of the pipeline ADC have been calibrated. If so, the operational control flow proceeds to step 610. Otherwise, the operational control flow reverts to step 602 to select another ADC module of the pipeline ADC for calibration.

At step 610, the operational control flow has calibrated all of the ADC modules of the pipeline ADC. Because the imperfections within the ADC modules can vary over various environmental conditions, such as temperature or humidity to provide some examples, the operational control flow can revert back to step 602 to once again calibrate all of the ADC modules of the pipeline ADC. The operational control flow can periodically revert back to step 602, revert back to step 602 in response to an event, such as a change in the various environmental conditions or a command from another electrical, mechanical, or electro-mechanical device communicatively coupled to the pipeline ADC, or any other instance in time that will be apparent to those skilled in the relevant art(s) without departing from the spirit and scope of the present di se to awe.

Multiple Pipeline ADC Module

Figure 7:
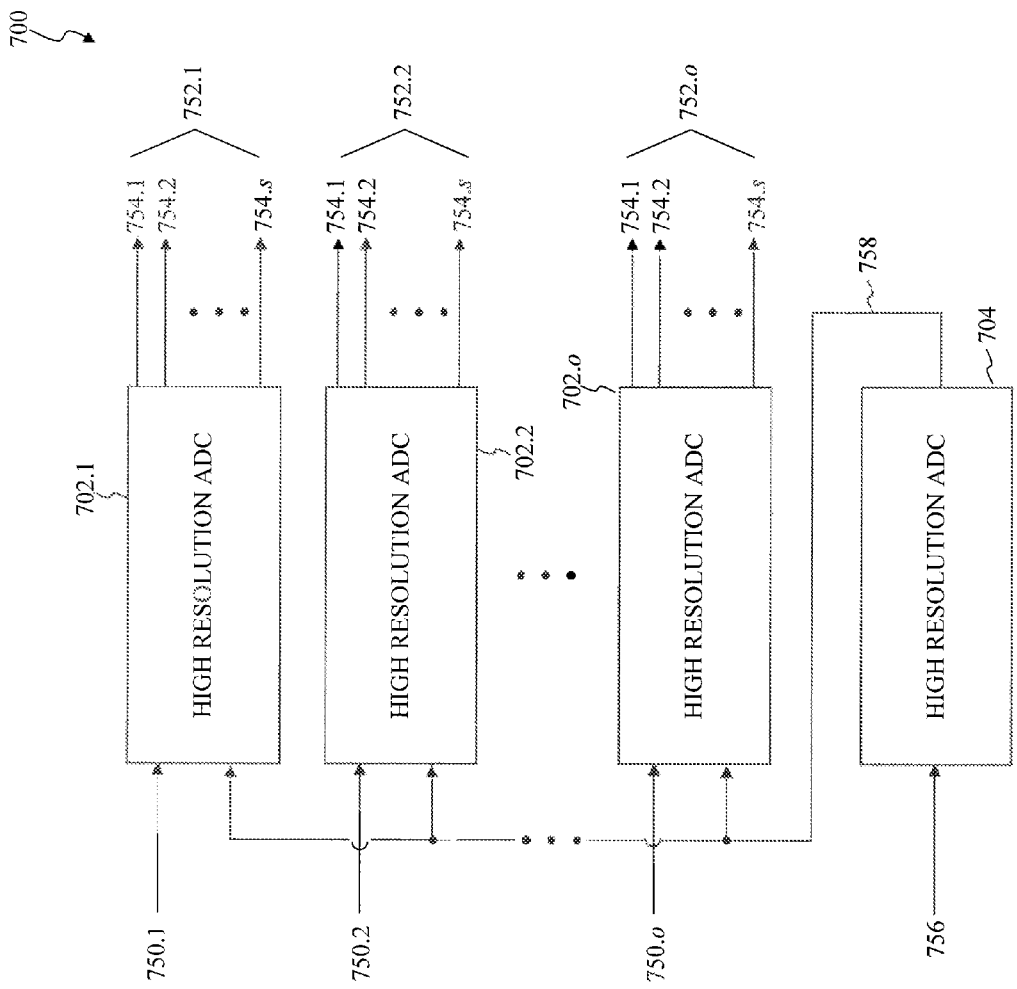
FIG. 7 illustrates a block diagram of a pipeline ADC module according to an exemplary embodiment of the present disclosure.

FIG. 7 illustrates a block diagram of a pipeline ADC module according to an exemplary embodiment of the present disclosure. A pipeline ADC module 700 includes multiple pipeline ADCs 702.1 through 702.$o$ which receive one or more coefficients, or sets of coefficients, various weighting factors, various gain compensation parameters, and/or various offset compensation parameters from a calibration ADC 704. The one or more coefficients, or sets of coefficients, the various weighting factors, the various gain compensation parameters, and/or the various offset compensation parameters that are used by the multiple pipeline ADCs 702.1 through 702.$o$ can be calibrated by the calibration ADC 704.

The multiple pipeline ADCs 702.1 through 702.$o$ convert analog inputs 750.1 through 750.$o$ from the analog signal domain to the digital signal domain to provide digital output signals 752.1 through 752.$o$, each of the digital output signals 752.1 through 752.$o$ can include a similar or a dissimilar number of digital outputs 754.1 through 754.$s$. Additionally, the multiple pipeline ADCs 702.1 through 702.$o$ compensate for interference or distortion impressed onto various signals within these multiple pipeline ADCs which are caused h their corresponding imperfections using compensation parameters 758. One or more of the multiple pipeline ADCs 702.1 through 702.$o$ can be implemented using the pipeline ADC 200.

The calibration ADC 704 represents a replica of one or more of the multiple pipeline ADCs 702.1 through 702.$o$. As such, the calibration ADC 704 shares substantially similar imperfections as the multiple pipeline ADCs 702.1 through 702.$o$. This allows the calibration ADC 704 to be used to determine the compensation parameters 758 using a digital calibration sequence 756, such as the a digital calibration sequence 550 to provide an example, and to transfer the compensation parameters 758 to the Multiple pipeline ADCs 702.1 through 702.$o$. The compensation parameters 758 include one or more coefficients, or sets of coefficients, various weighting factors, various gain compensation parameters, and/or various offset compensation parameters that are used by the multiple pipeline ADCs 702.1 through 702.$o$. The calibration ADC 704 can be implemented using the pipeline ADC 500.

CONCLUSION

It is to be appreciated that the Detailed Description section, and not the Abstract section, is intended to be used to interpret the claims. The Abstract section can set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. A pipeline analog-to-digital converter (ADC), comprising:
    a plurality of ADC stages configured to convert their corresponding analog inputs from an analog signal domain to a digital signal domain to provide a plurality of digital output signals and a plurality of residual analog signals; and
    a plurality of compensation stages, each compensation stage from among the plurality of compensation stages being coupled to a corresponding ADC stage from among the plurality of ADC stages, configured to compensate for interference or distortion impressed upon the plurality of residual analog signals by imperfections within the plurality of ADC stages.

2. The pipeline ADC of claim 1, wherein a first ADC stage from among the plurality of ADC stages is configured to convert an analog input from the analog signal domain to the digital signal domain to provide a first output signal from among the plurality of digital output signals.

3. The pipeline ADC of claim 1, wherein each of the plurality of residual signals represents a difference between an analog input of a corresponding ADC stage from among the plurality of ADC stages and a corresponding one of the plurality of digital output signals.

4. The pipeline ADC of claim 1, wherein the plurality of ADC stages are further configured to convert a corresponding residual signal from among the plurality of residual signals from the analog signal domain to the digital signal domain to provide a corresponding one of the plurality of digital output signals.

5. The pipeline ADC of claim 1, wherein the plurality of compensation stages comprise:
    a plurality of adaptive filtering modules configured to compensate for interference or distortion impressed upon a corresponding one of the residual analog signals by imperfections within its corresponding ADC stage based upon at least one digital output signal from among the digital output signals that corresponds to another ADC stage from among the plurality of ADC stages to provide a plurality of impairment compensated signals.

6. The pipeline ADC of claim 5, wherein the plurality of adaptive filtering modules are further configured to adjust a phase or an amplitude of the at least one digital output signal that corresponds to the other ADC stage based upon a plurality of equalization coefficients.

7. The pipeline ADC of claim 5, wherein the plurality of compensation stages further comprise:
    a plurality of combination modules configured to add the plurality of impairment compensated signals to the plurality of digital output signals to provide a plurality of digital outputs, the plurality of digital outputs being a digital representation of an analog input.

8. An analog-to-digital converter (ADC) module in a pipeline ADC, comprising
    an ADC configured to convert an analog input from an analog signal domain to a digital signal domain to provide a digital output signal;
    a digital-to-analog (DAC) configured to convert the digital output signal from the digital signal domain to the analog signal domain to provide an analog output;
    a combination module configured to subtract the digital output signal and the analog output to provide a residual analog signal, wherein imperfections within the ADC module impress interference or distortion onto the residual analog signal;
    an adaptive filter module configured to compensate for the interference or the distortion impressed onto the residual analog signal to provide an impairment compensated signal; and
    a second combination module configured to add the impairment compensated signal to the digital output signal to provide a digital output.

9. The ADC module of claim 8, wherein the ADC module is one of a plurality of ADC modules in the pipeline ADC, and
    wherein a second ADC from a second ADC module from among the plurality of ADC modules is configured to convert the residual analog signal from the analog signal domain to the digital signal domain to provide a second digital output signal.

10. The ADC module of claim 8, wherein the ADC module is one of a plurality of ADC modules in the pipeline ADC,
    wherein a second ADC module from among the plurality of ADC modules is configured to provide a second digital output, the second digital output being a digital representation of the residual analog signal, and
    wherein the adaptive filter module is further configured to compensate for the interference or the distortion impressed onto the residual analog signal based upon the second digital output.

11. The ADC module of claim 10, wherein a third ADC module from among the plurality of ADC modules is configured to provide a third digital output, the third digital output being a digital representation of a second residual analog signal provided by the second ADC module, and
    wherein the adaptive filter module is further configured to compensate for the interference or the distortion impressed onto the residual analog signal based upon the third digital output.

12. The ADC module of claim 10, wherein the adaptive filter module is farther configured to adjust a phase or an amplitude of the second digital output based upon a plurality of equalization coefficients.

13. The ADC module of claim 12, wherein the plurality of equalization coefficients are determined using an adaptive filtering algorithm.

14. A method for converting an analog input from an analog signal domain to a digital signal domain to provide a digital output, comprising:
    converting the analog input from the analog signal domain to the digital signal domain to provide a digital output signal and a residual signal, the residual signal representing a difference between the analog input and the digital output signal;

converting the residual signal from the analog signal domain to the digital signal domain to provide a second digital output signal;

compensating for interference or distortion impressed onto the residual analog signal based upon the second digital output signal to provide an impairment compensated signal; and adding the impairment compensated signal from the digital output signal to provide the digital output.

15. The method of claim 14, wherein converting the analog input further comprises:

converting the analog input from the analog signal domain to the digital signal domain to provide the digital output signal;

converting the digital output signal from the digital signal domain to the analog signal domain to provide an analog output; and subtracting the analog output from the analog input to provide the residual signal.

16. The method of claim 14, wherein converting the residual signal further comprises:

converting the residual signal from the analog signal domain to the digital signal domain to provide the second digital output signal and a second residual signal, and further comprising:

converting the second residual signal from the analog signal domain to the digital signal domain to provide a third digital output signal.

17. The method of claim 16, wherein converting the residual signal further comprises:

converting the residual signal from the analog signal domain to the digital signal domain to provide the second digital output signal;

converting the second digital output signal from the digital signal domain to the analog signal domain to provide an analog output; and subtracting the analog output from the residual signal to provide the second residual signal.

18. The method of claim 16, further comprising:

compensating for interference or distortion impressed onto the second residual analog: based upon the third digital output signal to provide a second impairment compensated signal, and wherein compensating for interference or distortion impressed onto the residual analog signal comprises:

adjusting a phase or an amplitude of the second impairment compensated signal based upon a plurality of equalization coefficients.

19. The method of claim 18, further comprising:

determining the plurality of equalization coefficients using an adaptive filtering algorithm.

20. The method of claim 19, further comprising:

determining the plurality of equalization coefficients in response to a digital calibration sequence.

* * * * *

UNITED STATES PATENT AND TRADEMARK OFFICE
CERTIFICATE OF CORRECTION

| | | |
|---|---|---|
| PATENT NO. | : 8,717,209 B2 | |
| APPLICATION NO. | : 13/604184 | |
| DATED | : May 6, 2014 | |
| INVENTOR(S) | : Wu et al. | |

It is certified that error appears in the above-identified patent and that said Letters Patent is hereby corrected as shown below:

In the Specification:

Column 14, lines 20-21, please replace "di se to awe" with --disclosure--.

In the Claims:

Column 16, line 53, claim 12, please replace "farther" with --further--.

Column 18, line 13, claim 18, please delete ":" between --analog-- and --based--.

Signed and Sealed this
Fifteenth Day of July, 2014

Michelle K. Lee
*Deputy Director of the United States Patent and Trademark Office*